US012748162B2

(12) United States Patent
Liu et al.

(10) Patent No.: US 12,748,162 B2
(45) Date of Patent: Sep. 29, 2026

(54) BATTERY INTERNAL-SHORT-CIRCUIT DETECTION METHOD, ELECTRONIC DEVICE, AND STORAGE MEDIUM

(71) Applicant: DONGGUAN NVT TECHNOLOGY LIMITED, Dongguan (CN)

(72) Inventors: Boyang Liu, Dongguan (CN); Zhifeng Wang, Dongguan (CN)

(73) Assignee: Dongguan NVT Technology Limited, Dongguan City (CN)

( * ) Notice: Subject to any disclaimer, the term of this patent is extended or adjusted under 35 U.S.C. 154(b) by 371 days.

(21) Appl. No.: 18/334,696

(22) Filed: Jun. 14, 2023

(65) Prior Publication Data

US 2023/0324473 A1 Oct. 12, 2023

Related U.S. Application Data

(63) Continuation of application No. PCT/CN2020/136585, filed on Dec. 15, 2020.

(51) Int. Cl.

| | |
|---|---|
| ***G01R 31/52*** | (2020.01) |
| ***G01R 31/385*** | (2019.01) |
| ***H01M 10/48*** | (2006.01) |

(52) U.S. Cl.

CPC ........... *G01R 31/52* (2020.01); *G01R 31/385* (2019.01); *H01M 10/48* (2013.01)

(58) Field of Classification Search

CPC .. G01R 31/367; G01R 31/378; G01R 31/379; G01R 31/38–396; G01R 31/3646;

(Continued)

(56) References Cited

U.S. PATENT DOCUMENTS

| | | | | |
|---|---|---|---|---|
| 2011/0199054 | A1 | 8/2011 | Burchardt et al. | |
| 2019/0305384 | A1* | 10/2019 | Liu | G01R 31/367 |
| 2022/0016996 | A1* | 1/2022 | Yang | B60L 58/18 |

FOREIGN PATENT DOCUMENTS

| | | | |
|---|---|---|---|
| CN | 110626210 | A | 12/2019 |
| CN | 110764015 | A | 2/2020 |

(Continued)

OTHER PUBLICATIONS

ISR for International Application PCT/CN2020/136585 mailed Sep. 13, 2021.

(Continued)

*Primary Examiner* — Lee E Rodak
*Assistant Examiner* — Demetrius R Pretlow
(74) *Attorney, Agent, or Firm* — WHDA, LLP

(57) ABSTRACT

A method for detecting an internal-short-circuit in a battery. The method includes: obtaining a battery-charging standard parameter (S21); obtaining a voltage $V_0$ of a battery when the battery enters a constant-current charging phase (S22); obtaining a voltage difference ΔV generated across a charging time frame Δt during constant-current charging of the battery (S23); obtaining a charge current I when the battery has been charged for the time frame Δt (S24); determining an internal short circuit resistance $R_i$ of the battery based on the battery-charging standard parameter, the voltage $V_0$, the voltage difference ΔV, and the charge current I (S25); and determining, based on the internal short circuit resistance $R_i$ of the battery, whether an internal short circuit exists in the battery (S26).

16 Claims, 6 Drawing Sheets

(58) Field of Classification Search
CPC .... G01R 31/364; G01R 31/385; G01R 31/36; H01M 10/48; H01M 10/482
See application file for complete search history.

(56) References Cited

FOREIGN PATENT DOCUMENTS

| | | | |
|---|---|---|---|
| CN | 110907843 | A | 3/2020 |
| CN | 111198327 | A | 5/2020 |
| CN | 111474488 | A | 7/2020 |
| CN | 112666477 | A | 4/2021 |

OTHER PUBLICATIONS

Written Opinion for International Application PCT/CN2020/136585 mailed Sep. 13, 2021.

* cited by examiner

BATTERY INTERNAL-SHORT-CIRCUIT DETECTION METHOD, ELECTRONIC DEVICE, AND STORAGE MEDIUM

CROSS REFERENCE TO RELATED APPLICATIONS

This application is a continuation application of PCT/CN2020/136585, filed on Dec. 15, 2020, the disclosure of which is hereby incorporated by reference in its entirety.

TECHNICAL FIELD

This application relates to the technical field of batteries, and in particular, to a battery internal-short-circuit detection method, an electronic device, and a storage medium.

BACKGROUND

Currently, a battery is prone to an internal short circuit for reasons such as: a separator of the battery is damaged, impurity particles are introduced during manufacturing of the battery, an electrode material of the battery is dissolved and deposited, dendrites are formed due to lithium plating on an electrode of the battery. The internal short circuit of the battery becomes severer over time. Consequently, the internal short circuit may cause the battery to burn or even explode, and damage life and property of the user. It is currently possible to determine occurrence of an internal short circuit in the battery by detecting the change in a terminal voltage of the battery that has been stored for a period in comparison with the terminal voltage of the battery prior to the storage. However, this method requires the battery to be in a state of absence of an external current for a long time, and is unable meet the requirement in an application scenario in which a portable electronic device is frequently charged and discharged.

SUMMARY

In view of the situation above, it is necessary to provide a battery internal-short-circuit detection method, an electronic device, and a storage medium to determine, by detecting an internal short circuit resistance of a stand-alone battery during charging of the stand-alone battery, whether an internal short circuit exists in the battery.

An embodiment of this application provides a battery internal-short-circuit detection method. The method includes:

- obtaining a battery-charging standard parameter;
- obtaining a voltage $V_0$ of a battery when the battery enters a constant-current charging phase;
- obtaining a voltage difference $\Delta V$ generated across a charging time frame $\Delta t$ during constant-current charging of the battery;
- obtaining a charge current I when the battery has been charged for the time frame $\Delta t$;
- determining an internal short circuit resistance $R_i$ of the battery based on the battery-charging standard parameter, the voltage $V_0$, the voltage difference $\Delta V$, and the charge current I; and
- determining, based on the internal short circuit resistance $R_i$ of the battery, whether an internal short circuit exists in the battery.

According to some embodiments of this application, the obtaining a voltage difference $\Delta V$ generated across a charging time frame $\Delta t$ during constant-current charging of the battery includes:

- obtaining a voltage $V_1$ of the battery at a constant-current charging time point $t_1$;
- obtaining a voltage $V_2$ of the battery at a constant-current charging time point $t_2$, where $t_2=t_1+\Delta t$; and
- determining the voltage difference $\Delta V$ based on the voltage $V_1$ and the voltage $V_2$.

The obtaining a charge current I when the battery has been charged for the time frame $\Delta t$ includes: obtaining a charge current I of the battery in a time frame from the time point $t_1$ to the time point $t_2$.

According to some embodiments of this application, the obtaining a battery-charging standard parameter includes: obtaining the battery-charging standard parameter that is obtained through an equivalent circuit model of the battery.

According to some embodiments of this application, before the obtaining the battery-charging standard parameter that is obtained through an equivalent circuit model of the battery, the method further includes:

- obtaining a first standard voltage difference equation that includes a standard parameter equation of the battery, where the first standard voltage difference equation is obtained through the equivalent circuit model of the battery;
- obtaining each standard voltage difference of the battery generated across the charging time frame $\Delta t$ during the charging performed at different standard charge currents under different numbers of cycles; and
- determining the battery-charging standard parameter based on the first standard voltage difference equation and each standard voltage difference of the battery generated across the charging time frame $\Delta t$ during the charging performed at different standard charge currents under different numbers of cycles, where the battery-charging standard parameter is obtained through the equivalent circuit model of the battery.

According to some embodiments of this application, before the obtaining a first standard voltage difference equation that includes a standard parameter equation of the battery, where the first standard voltage difference equation is obtained through the equivalent circuit model of the battery, the method further includes:

- determining a standard equation of the equivalent circuit model of the battery based on a capacitance definition formula and a current definition formula;
- determining, based on the standard equation of the equivalent circuit model of the battery, a second standard voltage difference equation generated when the battery has been charged for the time frame $\Delta t$; and
- determining the first standard voltage difference equation based on the second standard voltage difference equation.

According to some embodiments of this application, the standard equation of the equivalent circuit model of the battery includes:

$$V_{standard} = U_{oc} + U_{s0}e^{-\frac{t}{R_sC_s}} + R_SI_{standard}\left(1 - e^{-\frac{t}{R_SC_S}}\right) + I_{standard}R_0.$$

In the equation above, $V_{standard}$ is a standard voltage of the battery, $U_{oc}$ is an open circuit voltage of the battery, $U_{s0}$ is an initial component voltage value of a polarization capacitor of the battery in a statically standing state, t is a charging time length of the battery, $R_s$ is a polarizing internal resistance of the battery, $C_s$ is a polarization capacitance of the battery, $I_{standard}$ is a standard charge current of the battery, and $R_0$ is an ohmic internal resistance of the battery.

According to some embodiments of this application, the battery-charging standard parameter includes a first battery-charging standard parameter and a second battery-charging standard parameter, and the first standard voltage difference equation includes:

$$\Delta V_{standard} = \alpha I_{standard} - \alpha\beta.$$

In the equation above, $$\alpha = R_S\left(e^{-\frac{t_1}{R_S C_S}} - e^{-\frac{t_2}{R_S C_S}}\right), \text{ and } \beta = \frac{U_{s0}}{R_S}.$$

In the equation above, $t_2=t_1+\Delta t$, $\Delta V_{standard}$ is a standard voltage difference generated when the battery has been charged for the time frame $\Delta t$, $I_{standard}$ is a standard charge current when the battery has been charged for the time frame $\Delta t$, $\alpha$ is the first battery-charging standard parameter, $R_s$ is a polarizing internal resistance of the battery, $t_1$ is a first constant-current charging time point, $C_s$ is a polarization capacitance of the battery, $t_2$ is a second constant-current charging time point, $\beta$ is the second battery-charging standard parameter, and $U_{s0}$ is an initial component voltage value of a polarization capacitor of the battery in a statically standing state.

According to some embodiments of this application, the determining an internal short circuit resistance $R_i$ of the battery based on the battery-charging standard parameter, the voltage $V_0$, the voltage difference $\Delta V$, and the charge current I includes:

- determining a first equation of an equivalent circuit model of the battery based on a capacitance definition formula and a current definition formula;
- determining, based on the first equation of the equivalent circuit model of the battery, a voltage difference equation generated when the battery has been charged for the time frame $\Delta t$; and
- determining an internal short circuit resistance $R_i$ of the battery based on the voltage difference equation, the battery-charging standard parameter, the voltage $V_0$, the voltage difference $\Delta V$, and the charge current I.

According to some embodiments of this application, the first equation of the equivalent circuit model of the battery includes:

$$V = IR_S + IR_0 + U_{oc} - R_S\left(I - \frac{U_{s0}}{R_S} + \frac{V_0}{R_i}\right)e^{-\frac{t}{R_S C_S}}.$$

In the equation above, V is a voltage of the battery, I is the charge current when the battery has been charged for the time frame $\Delta t$, $R_s$ is a polarizing internal resistance of the battery, $R_0$ is an ohmic internal resistance of the battery, $U_{oc}$ is an open circuit voltage of the battery, $U_{s0}$ is an initial component voltage value of a polarization capacitor of the battery in a statically standing state, $V_0$ is a voltage of the battery when the battery enters the constant-current charging phase, and $R_i$ is an internal short circuit resistance of the battery.

According to some embodiments of this application, the determining a first equation of an equivalent circuit model of the battery based on a capacitance definition formula and a current definition formula includes:

- creating the equivalent circuit model of the battery;
- determining a second equation of the equivalent circuit model of the battery based on the Ohm's law and the Kirchhoff's law; and
- determining the first equation of the equivalent circuit model of the battery based on the capacitance definition formula, the current definition formula, and the second equation of the equivalent circuit model of the battery.

According to some embodiments of this application, the determining the first equation of the equivalent circuit model of the battery based on the capacitance definition formula, the current definition formula, and the second equation of the equivalent circuit model of the battery includes:

- determining a differential equation of a component voltage of a polarization capacitor of the battery based on the capacitance definition formula and the current definition formula;
- solving the differential equation of the component voltage of the polarization capacitor of the battery to determine a general solution to the component voltage of the polarization capacitor of the battery; and
- determining the first equation of the equivalent circuit model of the battery based on the second equation of the equivalent circuit model of the battery and the general solution to the component voltage of the polarization capacitor of the battery.

According to some embodiments of this application, the differential equation of the component voltage of the polarization capacitor of the battery includes:

$$C_S\frac{dU_S}{dt} + \frac{U_S}{R_S} = I - \frac{V}{R_i}.$$

In the equation above, $C_s$ is a polarization capacitance of the battery, $U_s$ is the component voltage of the polarization capacitor of the battery, $R_s$ is a polarizing internal resistance of the battery, I is a charge current when the battery has been charged for the time frame $\Delta t$, V is a voltage of the battery, and $R_i$ is an internal-short-circuit resistance of the battery.

The general solution to the component voltage of the polarization capacitor of the battery includes:

$$U_S = \left(U_{S0} - \frac{V_0}{R_i}R_S\right)e^{-\frac{t}{R_S C_S}} + R_S\left(I - \frac{V}{R_i}\right)\left(1 - e^{-\frac{t}{R_S C_S}}\right).$$

In the equation above, $U_s$ is the component voltage of the polarization capacitor of the battery, $U_{s0}$ is an initial component voltage value of the polarization capacitor of the battery in a statically standing state, $V_0$ is the voltage of the battery when the battery enters the constant-current charging phase, $R_i$ is the internal short circuit resistance of the battery, $R_s$ is the polarizing internal resistance of the battery, t is a charging time length of the battery, $C_s$ is the polarization capacitance of the battery, I is the charge current when the battery has been charged for the time frame $\Delta t$, and V is the voltage of the battery.

According to some embodiments of this application, before the determining an internal short circuit resistance $R_i$ of the battery based on the voltage difference equation, the battery-charging standard parameter, the voltage $V_0$, the voltage difference $\Delta V$, and the charge current I, the method further includes: obtaining a standard parameter equation of the battery, where the standard parameter equation is obtained through the equivalent circuit model of the battery.

The determining an internal short circuit resistance $R_i$ of the battery based on the voltage difference equation, the battery-charging standard parameter, the voltage $V_0$, the voltage difference $\Delta V$, and the charge current I includes:

determining an internal short circuit resistance equation of the battery based on the voltage difference equation and the standard parameter equation of the battery; and determining the internal short circuit resistance $R_i$ of the battery based on the internal short circuit resistance equation of the battery, the battery-charging standard parameter, the voltage $V_0$, the voltage difference $\Delta V$, and the charge current I.

According to some embodiments of this application, the battery-charging standard parameter includes a first battery-charging standard parameter and a second battery-charging standard parameter, and the internal short circuit resistance equation of the battery includes:

$$R_i = \frac{V_0}{\frac{\Delta V}{\alpha} - I + \beta}.$$

In the equation above, $R_i$ is the internal short circuit resistance of the battery, $V_0$ is a voltage of the battery when the battery enters the constant-current charging phase, $\Delta V$ is the voltage difference generated across the charging time frame $\Delta t$ during constant-current charging of the battery, $\alpha$ is the first battery-charging standard parameter, $\beta$ is the second battery-charging standard parameter, and I is the charging current when the battery has been charged for the time frame $\Delta t$.

An embodiment of this application provides an electronic device. The electronic device includes:

a battery;

a processor; and a memory, where the memory stores a plurality of program modules, and the plurality of program modules are loaded by the processor and execute the battery internal-short-circuit detection method according to any one of the embodiments described above.

An embodiment of this application provides a storage medium. The storage medium stores at least one computer instruction. The instruction is loaded by a processor to execute the battery internal-short-circuit detection method according to any one of the embodiments described above.

In the battery internal-short-circuit detection method, the electronic device, and the storage medium according to some embodiments of this application, the internal short circuit resistance $R_i$ of the battery is determined based on the battery-charging standard parameter, the voltage $V_0$, the voltage difference $\Delta V$, and the charge current I, and whether an internal short circuit exists in the battery is determined based on the internal short circuit resistance $R_i$ of the battery. In this way, during charging of a stand-alone battery, whether an internal short circuit exists in the battery is determined by detecting the internal short circuit resistance of the stand-alone battery. The method satisfies an application scenario in which a portable electronic device is frequently charged and discharged.

LIST OF REFERENCE NUMERALS

Electronic device 100
Memory 11
Processor 12
Battery 13
Acquisition device 14
Timer 15

DETAILED DESCRIPTION

The following clearly and thoroughly describes the technical solutions in some embodiments of this application with reference to the drawings appended hereto. Evidently, the described embodiments are merely a part of but not all of the embodiments of this application.

All other embodiments derived by a person of ordinary skill in the art based on the embodiments of the present invention without making any creative effort fall within the protection scope of the present invention.

Figure 1:
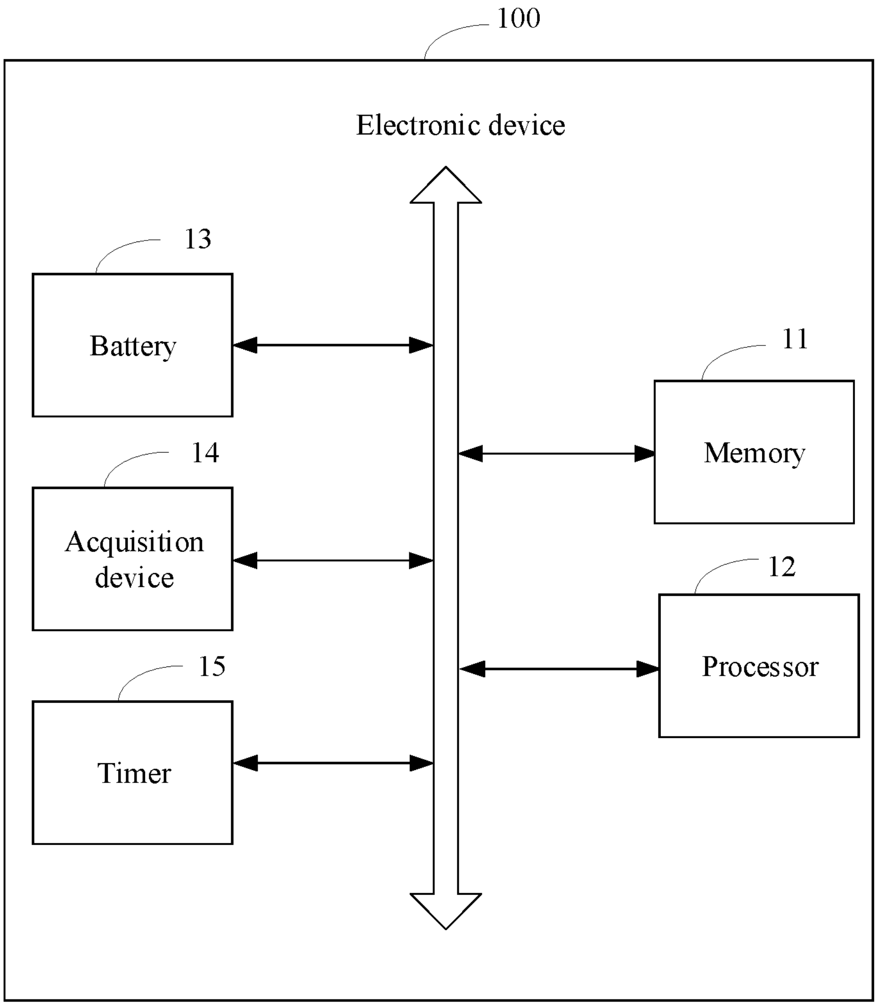
FIG. 1 is a schematic diagram of an electronic device according to an embodiment of this application.

Referring to FIG. 1, FIG. 1 is a schematic diagram of an electronic device according to an embodiment of this application. The electronic device 100 includes, but is not limited to, a memory 11, at least one processor 12, a battery 13, an acquisition device 14, and a timer 15. Such components may be interconnected directly or by a bus.

It is hereby noted that FIG. 1 describes merely an example of the electronic device 100. In other embodiments, the electronic device 100 may include more or fewer components, or may include other different components. The electronic device 100 may be an electric motorcycle, an electric bicycle, an electric vehicle, a mobile phone, a tablet computer, a personal digital assistant, a personal computer, or any other rechargeable devices as appropriate.

In an embodiment, the battery 13 may be a rechargeable battery configured to provide electrical energy to the electronic device 100. For example, the battery 13 may be a lead-acid battery, a nickel-cadmium battery, a nickel-hydrogen battery, a lithium-ion battery, a lithium polymer battery, a lithium iron phosphate battery, or the like. The battery 13 is logically connected to the processor 12 through a battery management system (BMS), so that functions such as charging and discharging are implemented through the battery management system. The battery management system may be connected in communication with a power conversion system (PCS) through CAN or RS485. The battery 13 includes a battery cell. The battery is rechargeable cyclically.

In this embodiment, the acquisition device 14 is configured to acquire a voltage of the battery 13 and a charge current of the battery 13. In this embodiment, the acquisition device 14 is configured to acquire a voltage of the battery cell of the battery 13 and a charge current of the battery cell of the battery 13. In this embodiment, the acquisition device 14 is an analog-to-digital converter. Understandably, the acquisition device 14 may be another voltage acquisition device or current acquisition device instead. The timer 15 is configured to record a time length of charging the battery cell of the battery 13 in a charging process. Understandably, the electronic device 100 may further include other devices, such as a pressure sensor, a light sensor, a gyroscope, a hygrometer, an infrared sensor, and the like.

Figure 2:
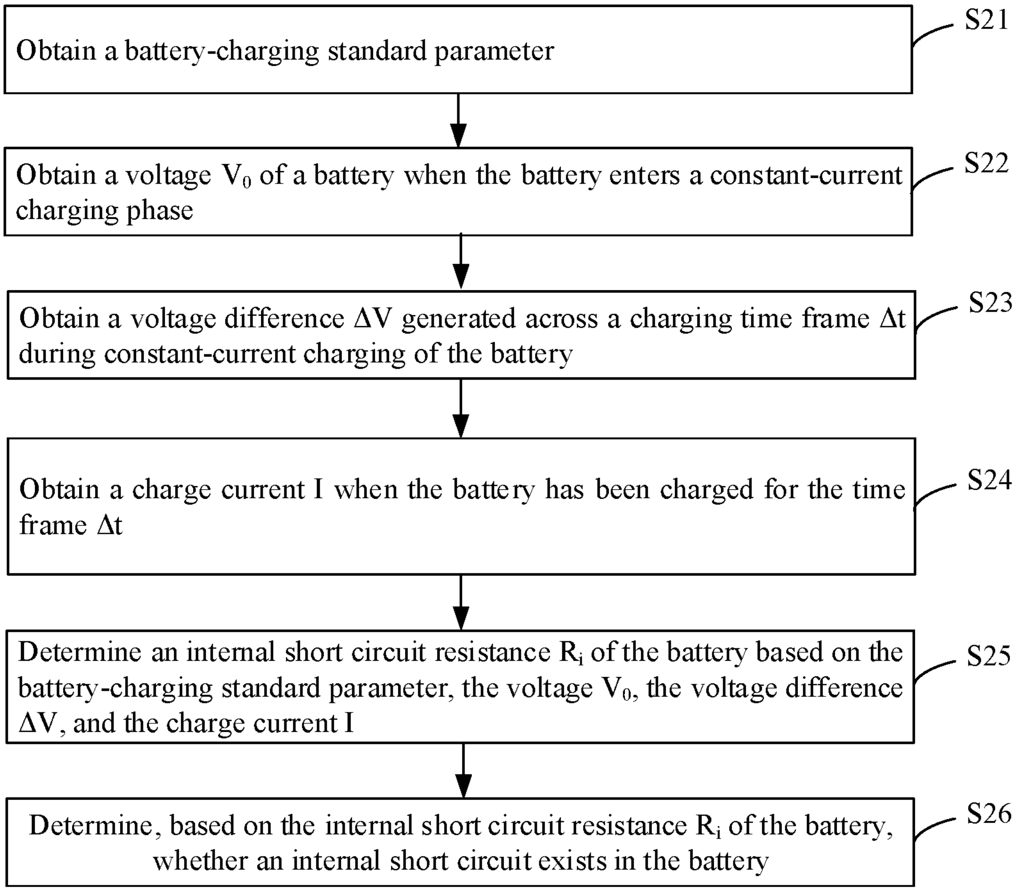
FIG. 2 is a flowchart of a battery internal-short-circuit detection method according to an embodiment of this application.

Referring to FIG. 2, FIG. 2 is a flowchart of a battery internal-short-circuit detection method according to an embodiment of this application. The battery internal-short-circuit detection method is applied to the battery. The battery internal-short-circuit detection method includes the following steps:

S21: Obtaining a battery-charging standard parameter.

Figure 3:
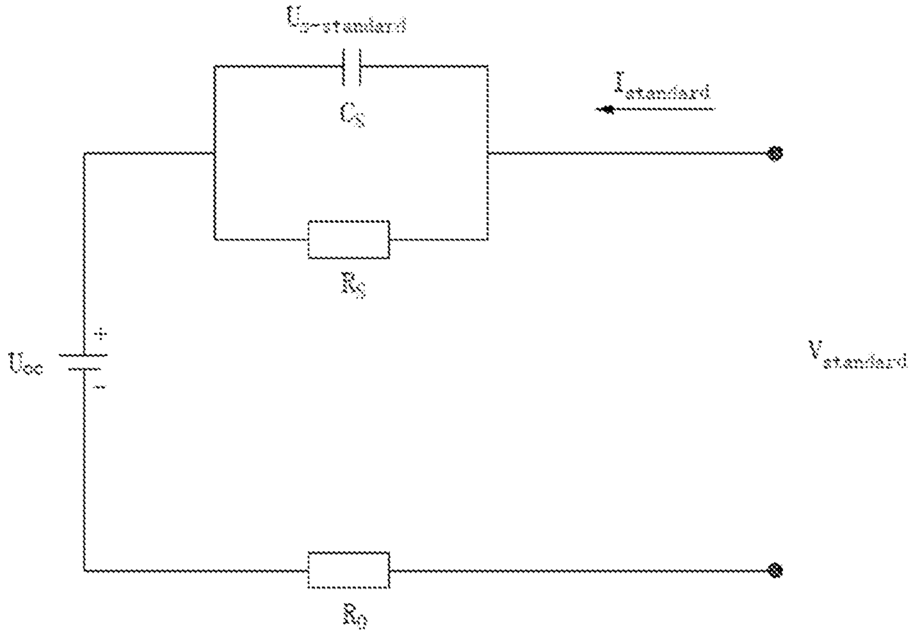
FIG. 3 is an equivalent circuit model of a battery when a standard parameter is obtained.

In this embodiment, the obtaining a battery-charging standard parameter includes: obtaining the battery-charging standard parameter that is obtained through an equivalent circuit model of the battery. The equivalent circuit model of the battery may be a Rint model, a Thevenin model, a PNGV model, a $2^{nd}$-order RC model, or the like. In this embodiment, the battery equivalent circuit model is a Thevenin model. Referring to FIG. 3, FIG. 3 is an equivalent circuit model of a battery when a standard parameter is obtained. In FIG. 3, $V_{standard}$ is a standard voltage of the battery, $U_{oc}$ is an open circuit voltage of the battery, $R_0$ is an ohmic internal resistance of the battery, $R_s$ is a polarizing internal resistance of the battery, $C_s$ is a polarization capacitance of the battery, $U_{s\text{-}standard}$ is a standard component voltage of a polarization capacitor of the battery, and $I_{standard}$ is a standard charge current of the battery.

Figure 4:
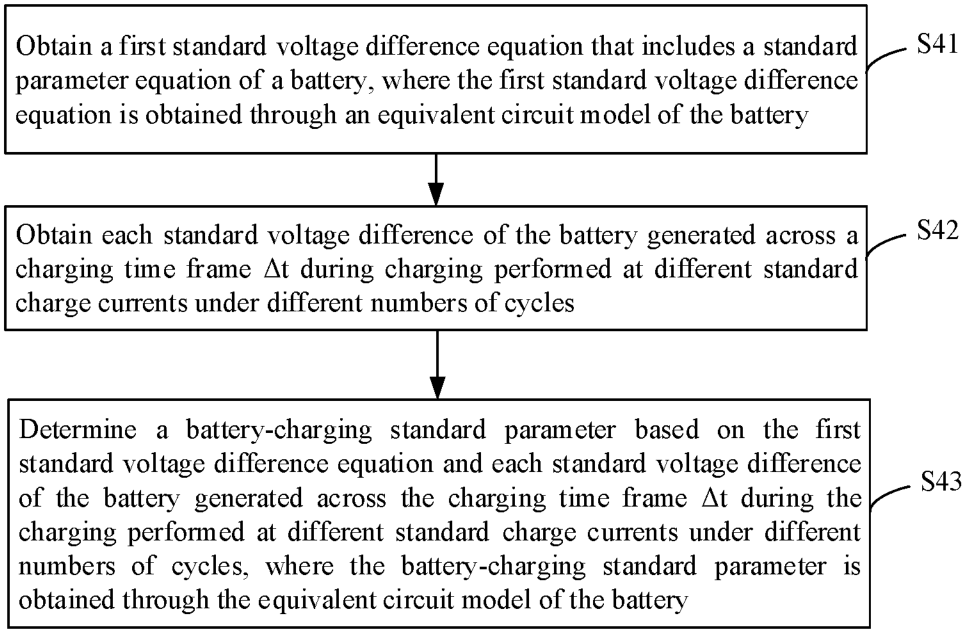
FIG. 4 is a flowchart of determining a battery-charging standard parameter in the battery internal-short-circuit detection method shown in FIG. 2.

Referring to FIG. 4, the obtaining the battery-charging standard parameter that is obtained through an equivalent circuit model of the battery includes:

S41: Obtaining a first standard voltage difference equation that includes a standard parameter equation of the battery, where the first standard voltage difference equation is obtained through the equivalent circuit model of the battery.

Figure 5:
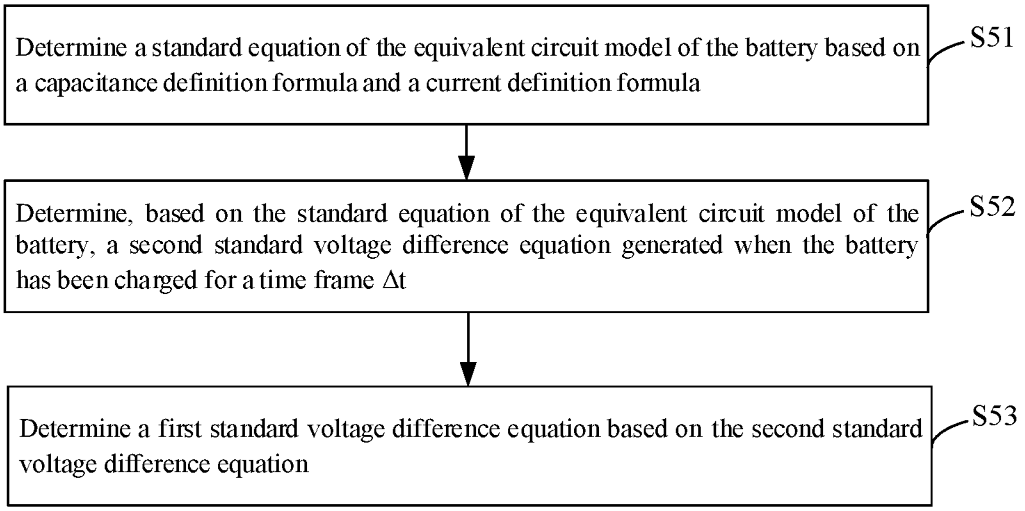
FIG. 5 is a flowchart of determining a first standard voltage difference equation in the battery internal-short-circuit detection method shown in FIG. 2.

In this embodiment, referring to FIG. 5, before the obtaining a first standard voltage difference equation that includes a standard parameter equation of the battery, where the first standard voltage difference equation is obtained through the equivalent circuit model of the battery, the method further includes:

S51: Determining a standard equation of the equivalent circuit model of the battery based on a capacitance definition formula and a current definition formula.

The capacitance definition formula includes:

$$U_{S-standard} = \frac{Q}{C_S}.$$

In me formula above, $U_{s\text{-}standard}$ is a standard component voltage of a polarization capacitor of the battery, Q is an amount of electric charge of the polarization capacitor of the battery, and $C_s$ is a polarization capacitance of the battery. The current definition formula includes:

$$I_{1-standard} = \frac{dQ}{dt}.$$

In the formula above, $I_{1\text{-}standard}$ is a standard charge current of the polarization capacitor of the battery, dQ is the amount of electric charge that passes through the polarization capacitor of the battery in a time frame, and dt is a time length spent by the electric charge in passing through the polarization capacitor of the battery.

The determining a standard equation of the equivalent circuit model of the battery based on a capacitance definition formula and a current definition formula includes the following steps:

a1: Creating the equivalent circuit model of the battery.

The equivalent circuit model of the battery is shown in FIG. 3. In this case, the battery is a standard battery, that is, a battery without an internal short circuit.

a2: Determining an equation of the equivalent circuit model of the battery based on the Ohm's law and the Kirchhoff's law.

The Ohm's law includes: $U_0=I_{standard}\times R_0$. In the equation above, $U_0$ is a voltage across an ohmic internal resistor of the battery, $I_{standard}$ is a standard charge current that flows through the ohmic internal resistor of the battery, and $R_0$ is an ohmic internal resistance of the battery. The Kirchhoff's law includes:

$$\sum_{k=1}^{m} v_k = 0,$$

where m is the number of components in a closed circuit in the equivalent circuit model of the battery, and $v_k$ is the voltage across the component.

The determining an equation of the equivalent circuit model of the battery based on the Ohm's law and the Kirchhoff's law includes:

b1: Determining a standard Kirchhoff voltage equation of the equivalent circuit model of the battery based on the Ohm's law.

The standard Kirchhoff voltage equation of the equivalent circuit model of the battery includes: $-V_{standard}+U_{s\text{-}standard}+U_{oc}+I_{standard}\times R_0=0$. In the equation above, $V_{standard}$ is a standard voltage of the battery, $U_{s\text{-}standard}$ is a standard component voltage of the polarization capacitor of the battery, $U_{oc}$ is an open circuit voltage of the battery, $I_{standard}$ is a standard charge current of the battery, and $R_0$ is an ohmic internal resistance of the battery.

b2: Determining the equation of the equivalent circuit model of the battery based on the standard Kirchhoff voltage equation of the equivalent circuit model of the battery.

The equation of the equivalent circuit model of the battery includes: $V_{standard}=U_{oc}+U_{s\text{-}standard}+I_{standard}\times R_0$. In the equation above, $V_{standard}$ is the standard voltage of the battery, $U_{oc}$ is the open circuit voltage of the battery, $U_{s\text{-}standard}$ is the standard component voltage of the polarization capacitor of the battery, $I_{standard}$ is the standard charge current of the battery, and $R_0$ is the ohmic internal resistance of the battery.

a3: Determining the standard equation of the equivalent circuit model of the battery based on the capacitance definition formula, the current definition formula, and the equation of the equivalent circuit model of the battery.

The determining the standard equation of the equivalent circuit model of the battery based on the capacitance definition formula, the current definition formula, and the equation of the equivalent circuit model of the battery includes:

c1: Determining a differential equation of a standard component voltage of a polarization capacitor of the battery based on the capacitance definition formula and the current definition formula.

The determining a differential equation of a standard component voltage of a polarization capacitor of the battery based on the capacitance definition formula and the current definition formula includes:

d1: Determining an equation of a standard charge current of the polarization capacitor of the battery based on the capacitance definition formula and the current definition formula.

The equation of the standard charge current of the polarization capacitor of the battery includes:

$$I_{1-standard} = \frac{dQ}{dt} = \frac{dU_S \times C_S}{dt} = C_S\frac{dU_S}{dt}.$$

In the equation above, $I_{1\text{-}standard}$ is the standard charge current of the polarization capacitor of the battery, dQ is the amount of electric charge that passes through the polarization capacitor of the battery in a time frame dt, dt is a time length spent by the electric charge in passing through the polarization capacitor of the battery, $U_{s\text{-}standard}$ is the standard component voltage of the polarization capacitor of the battery, and $C_s$ is the polarization capacitance of the battery.

d2: Determining a differential equation of the standard component voltage of the polarization capacitor of the battery based on the equation of the charge current of the polarization capacitor of the battery.

The differential equation of the standard component voltage of the polarization capacitor of the battery includes:

$$I_{standard} = I_{1-standard} + I_2 = C_S\frac{dU_{S-standard}}{dt} + \frac{U_{S-standard}}{R_S}.$$

That is, the differential equation of the standard component voltage of the polarization capacitor of the battery includes:

$$C_S\frac{dU_{S-standard}}{dt} + \frac{U_{S-standard}}{R_S} = I_{standard}.$$

In the equation above, $C_s$ is the polarization capacitance of the battery, $dU_{s\text{-}standard}$ is the standard voltage that runs across the polarization capacitor of the battery in a time frame, dt is the time length spent by the electric charge in passing through the polarization capacitor of the battery, $U_{s\text{-}standard}$ is the standard component voltage of the polarization capacitor of the battery, $R_s$ is the polarizing internal resistance of the battery, and $I_{standard}$ is the standard charge current of the battery.

c2: Solving the differential equation of the standard component voltage of the polarization capacitor of the battery to determine a general solution to the standard component voltage of the polarization capacitor of the battery.

The general solution to the standard component voltage of the polarization capacitor of the battery includes:

$$U_{S-standard} = U_{S0}e^{-\frac{t}{R_S C_S}} + R_S I_{standard}\left(1 - e^{-\frac{t}{R_S C_S}}\right).$$

In the equation above, $U_{s\text{-}standard}$ is the standard component voltage of the polarization capacitor of the battery, $U_{s0}$ is the initial component voltage value of the polarization capacitor of the battery in a statically standing state, t is the charging time length of the battery, $R_s$ is the polarizing internal resistance of the battery, $C_s$ is the polarization capacitance of the battery, $I_{standard}$ is the standard charge current of the battery.

c3: Determining the standard equation of the equivalent circuit model of the battery based on the equation of the equivalent circuit model of the battery and the general solution to the standard component voltage of the polarization capacitor of the battery.

The standard equation of the equivalent circuit model of the battery includes:

$$V_{standard} = U_{oc} + U_{S-standard} + I_{standard} \times R_0 = U_{oc} + U_{S0}e^{-\frac{t}{R_S C_S}} + R_S I_{standard}\left(1 - e^{-\frac{t}{R_S C_S}}\right) + I_{standard}R_0.$$

That is, the standard equation of the equivalent circuit model of the battery includes:

$$V_{standard} = U_{oc} + U_{s0}e^{-\frac{t}{R_s C_s}} + R_s I_{standard}\left(1 - e^{-\frac{t}{R_s C_s}}\right) + I_{standard}R_0.$$

In the equation above, $V_{standard}$ is the standard voltage of the battery, $U_{oc}$ is the open circuit voltage of the battery, $U_{s\text{-}standard}$ is the standard component voltage the polarization capacitor of the battery, $I_{standard}$ is the standard charge current of the battery, $R_0$ is the ohmic internal resistance of the battery, $U_{s0}$ is the initial component voltage value of the polarization capacitor of the battery in a statically standing state, t is the charging time length of the battery, $R_s$ is the polarizing internal resistance of the battery, and $C_s$ is the polarization capacitance of the battery.

S52: Determining, based on the standard equation of the equivalent circuit model of the battery, a second standard voltage difference equation generated when the battery has been charged for the time frame Δt.

The second standard voltage difference equation includes:

$$\Delta V_{standard} = \left(U_{oc} + U_{s0}e^{-\frac{t_2}{R_s C_s}} + R_s I_{standard}\left(1 - e^{-\frac{t_2}{R_s C_s}}\right) + I_{standard}R_0\right) - \left(U_{oc} + U_{s0}e^{-\frac{t_1}{R_s C_s}} + R_s I_{standard}\left(1 - e^{-\frac{t_1}{R_s C_s}}\right) + I_{standard}R_0\right) = \left(R_s I_{standard} - U_{s0}\right)\left(e^{-\frac{t_1}{R_s C_s}} - e^{-\frac{t_2}{R_s C_s}}\right).$$

That is, the second standard voltage difference equation includes:

$$\Delta V_{standard} = (R_s I_{standard} - U_{s0})\left(e^{-\frac{t_1}{R_s C_s}} - e^{-\frac{t_2}{R_s C_s}}\right).$$

In the equation above, $t_2=t_1+\Delta t$, $\Delta V_{standard}$ is the standard voltage difference generated when the battery has been charged for the time frame $\Delta t$, $U_{oc}$ is the open circuit voltage of the battery, $U_{s0}$ is the initial component voltage value of the polarization capacitor of the battery in a statically standing state, $t_1$ is the first constant-current charging time point, $R_s$ is the polarizing internal resistance of the battery, $C_s$ is the polarization capacitor of the battery, $I_{standard}$ is the standard charge current when the battery has been charged for the time frame $\Delta t$, $R_0$ is the ohmic internal resistance of the battery, and $t_2$ is the second constant-current charging time point.

S53: Determining the first standard voltage difference equation based on the second standard voltage difference equation.

The first standard voltage difference equation includes:

$$\Delta V_{standard} = (R_s I_{standard} U_{s0})\left(e^{-\frac{t_1}{R_s C_s}} - e^{-\frac{t_2}{R_s C_s}}\right) = R_s I_{standard}\left(e^{-\frac{t_1}{R_s C_s}} - e^{-\frac{t_2}{R_s C_s}}\right) - U_{s0}\left(e^{-\frac{t_1}{R_s C_s}} - e^{-\frac{t_2}{R_s C_s}}\right) = R_s I_{standard}\left(e^{-\frac{t_1}{R_s C_s}} - e^{-\frac{t_2}{R_s C_s}}\right) - \frac{U_{s0}}{R_s} R_s\left(e^{-\frac{t_1}{R_s C_s}} - e^{-\frac{t_2}{R_s C_s}}\right) = \alpha I_{standard} - \alpha\beta.$$

That is, the first standard voltage difference equation includes: $\Delta V_{standard}=\alpha I_{standard}-\alpha\beta$. In the equation above, $$\alpha = R_s\left(e^{-\frac{t_1}{R_s C_s}} - e^{-\frac{t_2}{R_s C_s}}\right), \text{ and } \beta = \frac{U_{s0}}{R_s}.$$

The formula $$\alpha = R_s\left(e^{-\frac{t_1}{R_s C_s}} - e^{-\frac{t_2}{R_s C_s}}\right)$$

and the formula $$\beta = \frac{U_{s0}}{R_s}$$

are standard parameter equations of the battery.

In the equations above, $t_2=t_1+\Delta t$, $\Delta V_{standard}$ is the standard voltage difference generated when the battery has been charged for the time frame $\Delta t$, $R_s$ is the polarizing internal resistance of the battery, $I_{standard}$ is the standard charge current when the battery has been charged for the time frame $\Delta t$, $U_{s0}$ is the initial component voltage value of the polarization capacitor of the battery in a statically standing state, $t_1$ is a first constant-current charging time point, $t_2$ is a second constant-current charging time point, $C_s$ is the polarization capacitance of the battery, $\alpha$ is the first battery-charging standard parameter, and $\beta$ is the second battery-charging standard parameter.

S42: Obtaining each standard voltage difference of the battery generated across the charging time frame $\Delta t$ during the charging performed at different standard charge currents under different numbers of cycles.

The obtaining each standard voltage difference of the battery generated across the charging time frame $\Delta t$ during the charging performed at different standard charge currents under different numbers of cycles may be, for example, obtaining the standard voltage difference of the battery generated from the $1^{st}$ second to the $11^{th}$ second during the constant-current charging performed at a constant current of 0.4 A, 0.8 A, 1.2 A, 1.6 A, 2 A, 2.4 A, 2.8 A, 3.2 A, 3.6 A, and 4 A respectively under different numbers of cycles after the battery is discharged at a current of 0.8 A until a cut-off voltage.

S43: Determining the battery-charging standard parameter based on the first standard voltage difference equation and each standard voltage difference of the battery generated across the charging time frame $\Delta t$ during the charging performed at different standard charge currents under different numbers of cycles, where the battery-charging standard parameter is obtained through the equivalent circuit model of the battery.

Figure 6:
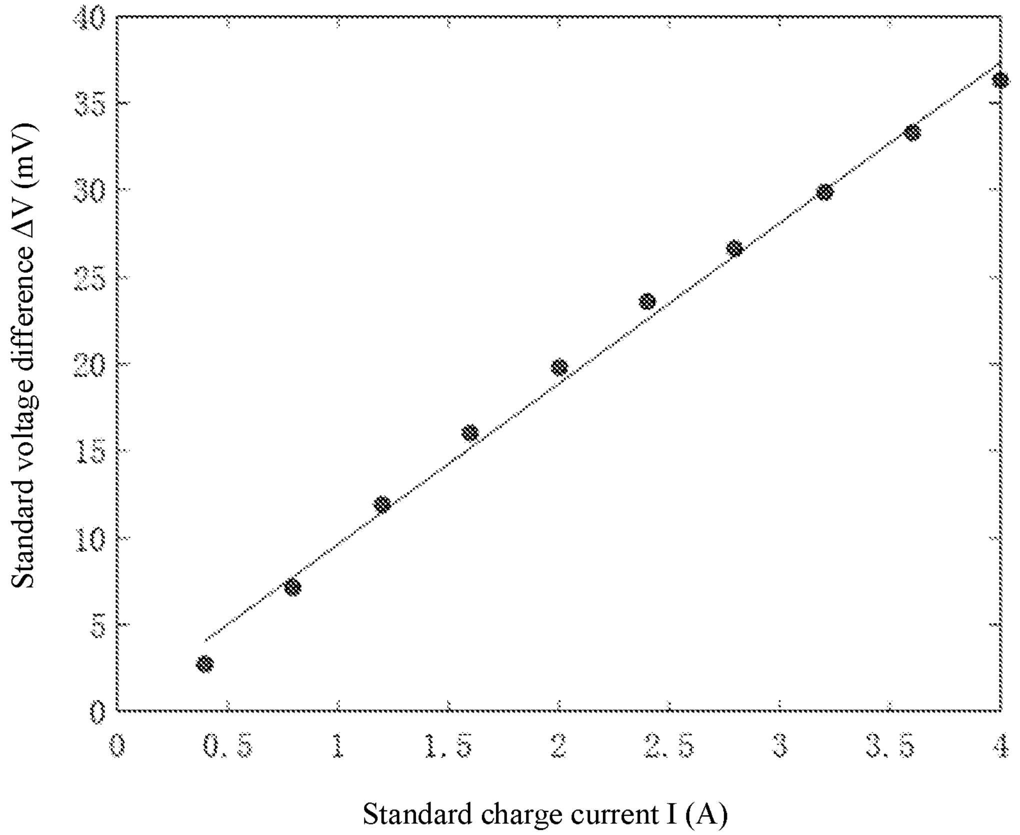
FIG. 6 is a schematic diagram of a relationship between a standard voltage difference and a standard charge current.

Referring to FIG. 6, FIG. 6 is a schematic diagram of a relationship between a standard voltage difference and a standard charge current. In FIG. 6, scattered points formed by the standard voltage difference and the standard charge current are arranged on roughly the same straight line. In this embodiment, for example, in FIG. 6, the first battery-charging standard parameter and the second battery-charging standard parameter are determined to be 9.2271 and 0.0411 respectively based on the first standard voltage difference equation and each standard voltage difference of the battery generated across the charging time frame $\Delta t$ during the charging performed at different standard charge currents under different numbers of cycles, where the battery-charging standard parameters are obtained through the equivalent circuit model of the battery.

S22: Obtaining a voltage $V_0$ of a battery when the battery enters a constant-current charging phase.

In this embodiment, an acquisition device obtains the voltage $V_0$ of the battery when the battery enters a constant-current charging phase.

The battery at this time, and a battery corresponding to the obtained battery attribute to be described below, and a battery corresponding to the determined battery attribute, may be a battery for which the battery-charging standard parameter is determined and a battery that may incur an internal short circuit over time, for example, a battery for which the battery-charging standard parameter is determined and which has been used for 6 months, that is, a battery identical to the battery for which the battery-charging standard parameter is determined. Alternatively, the battery at this time, and a battery corresponding to the obtained battery attribute to be described below, and a battery corresponding to the determined battery attribute, may be a battery of which an internal short circuit is to be determined, that is, a battery different from the battery for which the battery-charging standard parameter is determined.

S23. Obtaining a voltage difference $\Delta V$ generated across a charging time frame $\Delta t$ during constant-current charging of the battery.

In this embodiment, the obtaining a voltage difference $\Delta V$ generated across a charging time frame $\Delta t$ during constant-current charging of the battery includes:

e1: Obtaining a voltage $V_1$ of the battery at a constant-current charging time point $t_1$;

e2: Obtaining a voltage $V_2$ of the battery at a constant-current charging time point $t_2$, where $t_2=t_1+\Delta t$; and e3: Determining the voltage difference $\Delta V$ based on the voltage $V_1$ and the voltage $V_2$.

S24: Obtaining a charge current I when the battery has been charged for the time frame $\Delta t$.

The obtaining a charge current I when the battery has been charged for the time frame $\Delta t$ includes: obtaining a charge current I of the battery in a time frame from the time point $t_1$ to the time point $t_2$.

S25: Determining an internal short circuit resistance $R_i$ of the battery based on the battery-charging standard parameter, the voltage $V_0$, the voltage difference $\Delta V$, and the charge current I.

Figure 7:
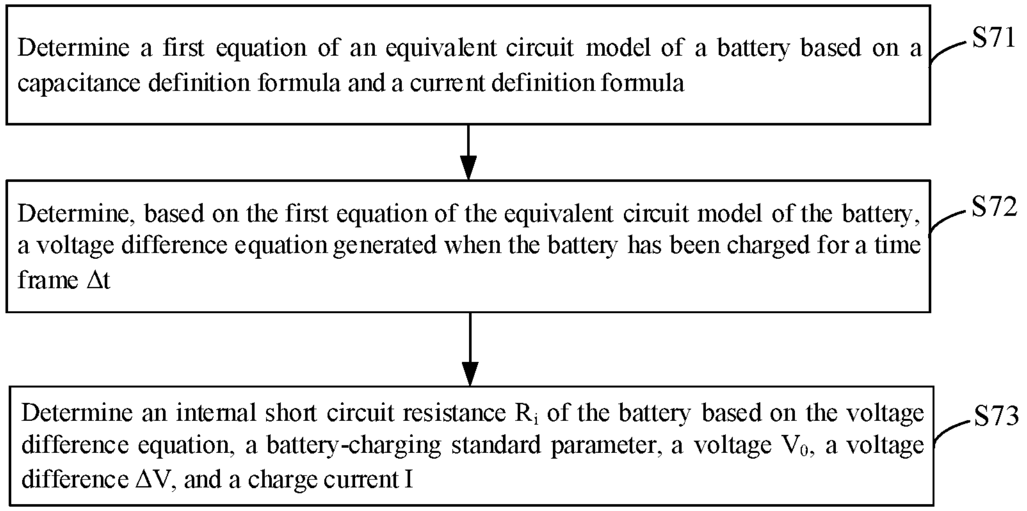
FIG. 7 is a flowchart of determining a battery internal-short-circuit resistance in the battery internal-short-circuit detection method shown in FIG. 2.

Referring to FIG. 7, the determining an internal short circuit resistance $R_i$ of the battery based on the battery-charging standard parameter, the voltage $V_0$, the voltage difference $\Delta V$, and the charge current I includes the following steps:

S71: Determining a first equation of an equivalent circuit model of the battery based on a capacitance definition formula and a current definition formula.

The capacitance definition formula includes:

$$U_s = \frac{Q}{C_S}.$$

In the Formula above, $U_s$ is a component voltage of a polarization capacitor of the battery, Q is an amount of electric charge of the polarization capacitor of the battery, and $C_s$ is a polarization capacitance of the battery. The current definition formula includes:

$$I_1 = \frac{dQ}{dt}.$$

In the formula above, $I_1$ is a charge current of the polarization capacitor of the battery, dQ is the amount of electric charge that passes through the polarization capacitor of the battery in a time frame, and dt is a time length spent by the electric charge in passing through the polarization capacitor of the battery.

Figure 8:
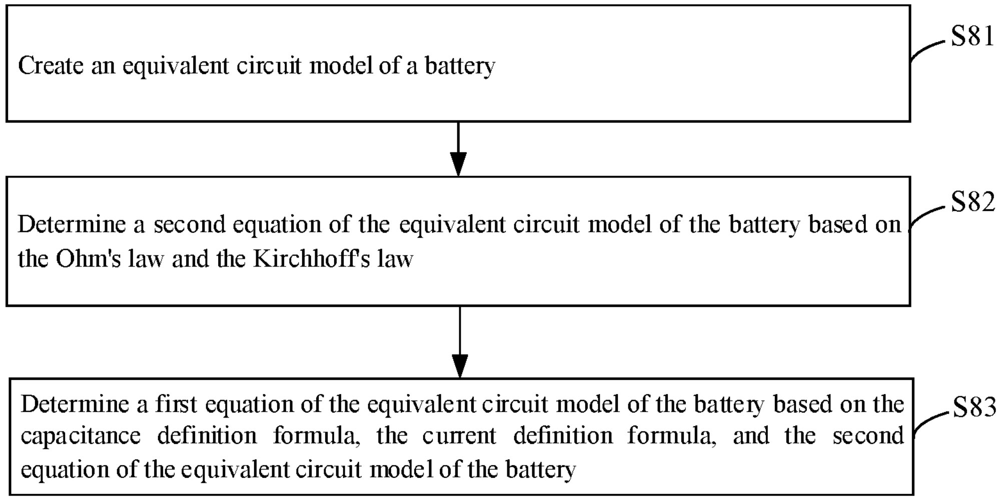
FIG. 8 is a flowchart of determining a first equation of an equivalent circuit model of a battery in the battery internal-short-circuit detection method shown in FIG. 2.

Referring to FIG. 8, the determining a first equation of an equivalent circuit model of the battery based on a capacitance definition formula and a current definition formula includes the following steps:

S81: Creating the equivalent circuit model of the battery.

Figure 9:
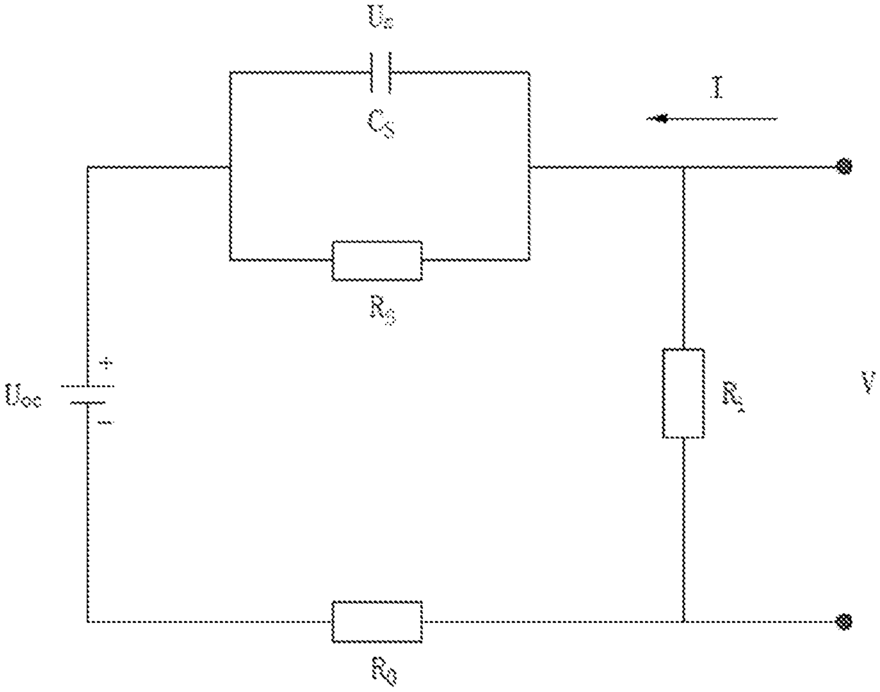
FIG. 9 is an equivalent circuit model of a battery for determining whether an internal short circuit exists in a battery.

The equivalent circuit model of the battery is shown in FIG. 9. At this time, an internal short circuit may exist in the battery. In FIG. 9, V is the voltage of the battery, $U_{oc}$ is the open circuit voltage of the battery, $R_0$ is the ohmic internal resistance of the battery, $R_s$ is the polarizing internal resistance of the battery, $C_s$ is the polarization capacitance of the battery, $U_s$ is the component voltage of the polarization capacitor of the battery, I is the charge current of the battery, and $R_i$ is the internal short circuit resistance of the battery.

S82: Determining a second equation of the equivalent circuit model of the battery based on the Ohm's law and the Kirchhoff's law.

The Ohm's law includes: $U_0 = I \times R_0$. In the equation above, $U_0$ is a voltage across an ohmic internal resistor of the battery, I is a charge current that flows through the ohmic internal resistor of the battery, and $R_0$ is an ohmic internal resistance of the battery. The Kirchhoff's law includes:

$$\sum_{k=1}^{m} v_k = 0,$$

where m is the number of components in a closed circuit in the equivalent circuit model of the battery, and $v_k$ is the voltage across the component.

The determining a second equation of the equivalent circuit model of the battery based on the Ohm's law and the Kirchhoff's law includes:

f1: Determining a Kirchhoff voltage equation of the equivalent circuit model of the battery based on the Ohm's law.

The Kirchhoff voltage equation of the equivalent circuit model of the battery includes:

$$-V + U_S + U_{oc} + \left(I - \frac{V}{R_i}\right) \times R_0 = 0.$$

In the equation above, V is the voltage of the battery, $U_s$ is the component voltage of the polarization capacitor of the battery, $U_{oc}$ is the open circuit voltage of the battery, I is the charge current of the battery, $R_i$ is the internal short circuit resistance of the battery, and $R_0$ is an ohmic internal resistance of the battery.

f2: Determining the second equation of the equivalent circuit model of the battery based on the Kirchhoff voltage equation of the equivalent circuit model of the battery.

The second equation of the equivalent circuit model of the battery includes:

$$V = U_{oc} + U_S + \left(I - \frac{V}{R_i}\right) \times R_0.$$

In the equation above, V is the voltage of the battery, $U_{oc}$ is the open circuit voltage of the battery, $U_s$ is the component voltage of the polarization capacitor of the battery, I is the charge current of the battery, $R_i$ is the internal short circuit resistance of the battery, and $R_0$ is the ohmic internal resistance of the battery.

S83: Determining the first equation of the equivalent circuit model of the battery based on the capacitance definition formula, the current definition formula, and the second equation of the equivalent circuit model of the battery.

Figure 10:
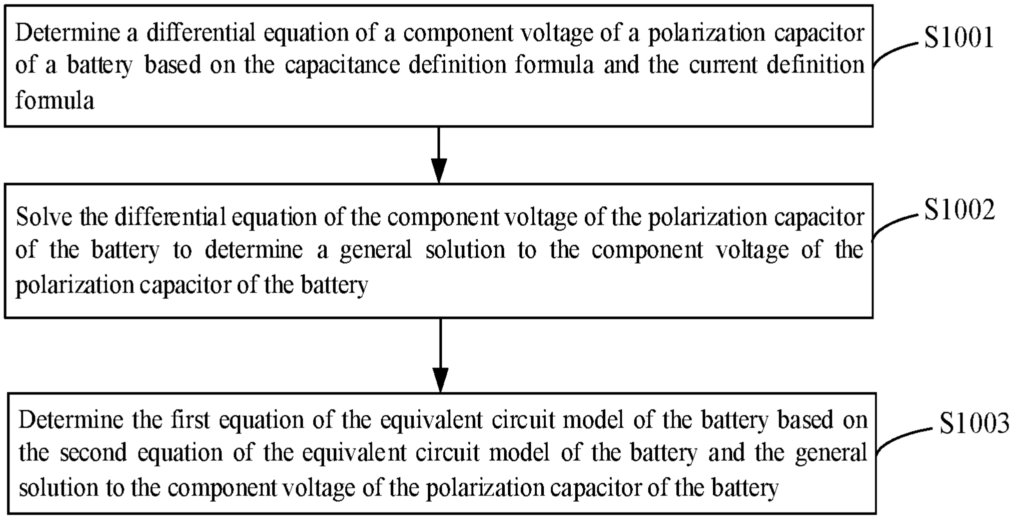
FIG. 10 shows how to determine a first equation of an equivalent circuit model of a battery in the battery internal-short-circuit detection method shown in FIG. 2.

Referring to FIG. 10, the determining the first equation of the equivalent circuit model of the battery based on the capacitance definition formula, the current definition formula, and the second equation of the equivalent circuit model of the battery includes the following step:

S1001: Determining a differential equation of a component voltage of a polarization capacitor of the battery based on the capacitance definition formula and the current definition formula.

The determining a differential equation of a component voltage of a polarization capacitor of the battery based on the capacitance definition formula and the current definition formula includes the following steps:

g1: Determining an equation of a charge current of the polarization capacitor of the battery based on the capacitance definition formula and the current definition formula.

The equation of the charge current of the polarization capacitor of the battery includes:

$$I_1 = \frac{dQ}{dt} = \frac{dU_s \times C_s}{dt} = C_S \frac{dU_s}{dt}.$$

In the equation above, $I_1$ is the charge current of the polarization capacitor of the battery, dQ is the amount of electric charge that passes through the polarization capacitor of the battery in a time frame dt, dt is a time length spent by the electric charge in passing through the polarization capacitor of the battery, $U_s$ is the component voltage of the polarization capacitor of the battery, and $C_s$ is the polarization capacitance of the battery.

g2: Determining a differential equation of the component voltage of the polarization capacitor of the battery based on the equation of the charge current of the polarization capacitor of the battery.

The differential equation of the component voltage of the polarization capacitor of the battery includes:

$$I-\frac{V}{R_i}=I_1+I_2=C_S\frac{dU_s}{dt}+\frac{U_s}{R_s}.$$

That is, the differential equation of the component voltage of the polarization capacitor of the battery includes:

$$C_S\frac{dU_s}{dt}+\frac{U_s}{R_s}=I-\frac{V}{R_i}.$$

In the equation above, $C_s$ is the polarization capacitance of the battery, $dU_s$ is the voltage that runs across the polarization capacitor of the battery in a time frame, dt is the time length spent by the electric charge in passing through the polarization capacitor of the battery, $U_s$ is the component voltage of the polarization capacitor of the battery, $R_s$ is the polarizing internal resistance of the battery, I is the charge current of the battery, V is the voltage of the battery, and $R_i$ is the internal short circuit resistance of the battery.

S1002: Solving the differential equation of the component voltage of the polarization capacitor of the battery to determine a general solution to the component voltage of the polarization capacitor of the battery.

The general solution to the component voltage of the polarization capacitor of the battery includes:

$$U_s=\left(U_{s0}-\frac{v_0}{R_i}R_S\right)e^{-\frac{t}{R_sC_s}}+R_s\left(I-\frac{V}{R_i}\right)\left(1-e^{-\frac{t}{R_sC_s}}\right).$$

In the equation above, $U_s$ is the component voltage of the polarization capacitor of the battery, $U_{s0}$ is the initial component voltage value of the polarization capacitor of the battery in a statically standing state, $V_0$ is the voltage of the battery when the battery enters the constant-current charging phase, $R_i$ is the internal short circuit resistance of the battery, $R_s$ is the polarizing internal resistance of the battery, t is the charging time length of the battery, $C_s$ is the polarization capacitance of the battery, I I is the charge current when the battery has been charged for the time frame Δt, and V is the voltage of the battery.

S1003: Determining the first equation of the equivalent circuit model of the battery based on the second equation of the equivalent circuit model of the battery and the general solution to the component voltage of the polarization capacitor of the battery.

The second equation of the equivalent circuit model of the battery includes:

$$V=U_{oc}+U_s+\left(I-\frac{V}{R_i}\right)\times R_0=$$
$$U_{oc}+\left(U_{s0}-\frac{V_0}{R_i}R_s\right)e^{-\frac{t}{R_sC_s}}+R_s\left(I-\frac{V}{R_i}\right)\left(1-e^{-\frac{t}{R_sC_s}}\right)+\left(I-\frac{V}{R_i}\right)R_0.$$

The internal short circuit resistance is much greater than the ohmic internal resistance and the polarizing internal resistance of the battery. Therefore, $$\frac{R_0}{R_i}\approx 0,\ \text{and}\ \frac{R_s}{R_i}\approx 0.$$

In addition, the purpose of this application is to determine whether an internal short circuit exists in the battery. Therefore, the value of $$\frac{V_0}{R_i}R_s$$

is not ignorable. Therefore, the first equation of the equivalent circuit model of the battery includes:

$$V=IR_S+IR_0+U_{oc}-R_s\left(I-\frac{U_{s0}}{R_s}+\frac{V_0}{R_i}\right)e^{-\frac{t}{R_sC_s}}.$$

In the equation above, V is the voltage of the battery, I is the charge current when the battery has been charged for the time frame Δt, $R_s$ is the polarizing internal resistance of the battery, $R_0$ is the ohmic internal resistance of the battery, $U_{oc}$ is the open circuit voltage of the battery, $U_{s0}$ is the initial component voltage value of the polarization capacitor of the battery in a statically standing state, $V_0$ is the voltage of the battery when the battery enters the constant-current charging phase, and $R_i$ is the internal short circuit resistance of the battery.

S72: Determining, based on the first equation of the equivalent circuit model of the battery, a voltage difference equation generated when the battery has been charged for the time frame Δt.

The voltage difference equation includes:

$$\Delta V=\left(IR_S+IR_0+U_{oc}-R_S\left(I-\frac{U_{s0}}{R_s}+\frac{V_0}{R_i}\right)e^{-\frac{t_2}{R_sc_s}}\right)-$$
$$\left(IR_S+IR_0+U_{oc}-R_s\left(I-\frac{U_{s0}}{R_s}+\frac{V_0}{R_i}\right)e^{-\frac{t_1}{R_sc_s}}\right)=$$
$$\left(I-\frac{U_{s0}}{R_s}+\frac{V_0}{R_i}\right)R_s\left(e^{-\frac{t_1}{R_sC_s}}-e^{-\frac{t_2}{R_sC_s}}\right).$$

In the equation above, $t_2=t_1+\Delta t$. ΔV is the voltage difference generated when the battery has been charged for the time frame Δt, 1 is the charge current when the battery has been charged for the time frame Δt, $R_s$ is the polarizing internal resistance of the battery, $R_0$ is the ohmic internal resistance of the battery, $U_{oc}$ is the open circuit voltage of the battery, $U_{s0}$ is the initial component voltage value of the polarization capacitor of the battery in a statically standing state, $V_0$ is the voltage of the battery when the battery enters the constant-current charging phase, $R_i$ is the internal short circuit resistance of the battery, $t_2$ is the second constant-current charging time point, $C_s$ is the polarization capacitance of the battery, and $t_1$ is the first constant-current charging time point.

S73: Determining an internal short circuit resistance $R_i$ of the battery based on the voltage difference equation, the battery-charging standard parameter, the voltage $V_0$, the voltage difference ΔV, and the charge current I.

Before the determining an internal short circuit resistance $R_i$ of the battery based on the voltage difference equation, the battery-charging standard parameter, the voltage $V_0$, the voltage difference ΔV, and the charge current I, the method further includes: obtaining a standard parameter equation of the battery, where the standard parameter equation is obtained through the equivalent circuit model of the battery.

The standard parameter equation of the battery includes:

$$\alpha = R_s\left(e^{-\frac{t_1}{R_sC_s}} - e^{-\frac{t_2}{R_sC_s}}\right), \text{ and } \beta = \frac{U_{so-standard}}{R_s}$$

In the equations above, α is the first battery-charging standard parameter, $R_s$ is the polarizing internal resistance of the battery, $t_1$ is the first constant-current charging time point, $C_s$ is the polarization capacitance of the battery, $t_2$ is the second constant-current charging time point, β is the second battery-charging standard parameter, and $U_{s0}$ is the initial component voltage value of the polarization capacitor of the battery in a statically standing state.

The determining an internal short circuit resistance $R_i$ of the battery based on the voltage difference equation, the battery-charging standard parameter, the voltage $V_0$, the voltage difference ΔV, and the charge current I includes the following steps:

h1: Determining an internal short circuit resistance equation of the battery based on the voltage difference equation and the standard parameter equation of the battery.

The voltage difference equation includes:

$$\Delta V = \left(I - \frac{U_{s0}}{R_s} + \frac{V_0}{R_i}\right)R_s\left(e^{-\frac{t_1}{R_sC_s}} - e^{-\frac{t_2}{R_sC_s}}\right) = \alpha\left(I - \beta + \frac{V_0}{R_i}\right),$$

and therefore, $$\frac{\Delta V}{\alpha} = \left(I - \beta + \frac{V_0}{R_i}\right).$$

Therefore, the internal short circuit resistance equation of the battery includes:

$$R_i = \frac{V_0}{\frac{\Delta v}{\alpha} - I + \beta}.$$

In the equation above, ΔV is the voltage difference generated when the battery has been charged for the time frame Δt, I is the charge current when the battery has been charged for the time frame Δt, $U_{s0}$ is the initial component voltage value of the polarization capacitor of the battery in a statically standing state, $R_s$ is the polarizing internal resistance of the battery, $V_0$ is the voltage of the battery when the battery enters the constant-current charging phase, $R_i$ is the internal short circuit resistance of the battery, $t_1$ is the first constant-current charging time point, $C_s$ is the polarization capacitance of the battery, $t_2$ is the second constant-current charging time point, a is the first battery-charging standard parameter, and β is the second battery-charging standard parameter.

h2: Determining the internal short circuit resistance $R_i$ of the battery based on the internal short circuit resistance equation of the battery, the battery-charging standard parameter, the voltage $V_0$, the voltage difference ΔV, and the charge current I.

In this embodiment, the internal short circuit resistance $R_i$ of the battery is determined by substituting the battery-charging standard parameter, the voltage $V_0$, the voltage difference ΔV, and the charge current I into the internal short circuit resistance equation of the battery.

S26: Determining, based on the internal short circuit resistance $R_i$ of the battery, whether an internal short circuit exists in the battery.

In this embodiment, based on the internal short circuit resistance $R_i$ of the battery and a first preset short circuit resistance, it is determined whether an internal short circuit exists in the battery. Preferably, the first preset short circuit resistance may be 600 ohms, or other values such as 500 ohms or 700 ohms, depending on specific needs. The determining, based on the internal short circuit resistance $R_i$ of the battery, whether an internal short circuit exists in the battery includes:

- determining, if the internal short circuit resistance $R_i$ of the battery is greater than or equal to the first preset short circuit resistance, that no internal short circuit exists in the battery; and
- determining, if the internal short circuit resistance $R_i$ of the battery is less than the first preset short circuit resistance, that an internal short circuit exists in the battery.

In this embodiment, in order to determine the severity level of the internal short circuit of the battery, the determining, if the internal short circuit resistance $R_i$ of the battery is less than the first preset short circuit resistance, that an internal short circuit exists in the battery includes:

- determining, if the internal short circuit resistance $R_i$ of the battery is less than the first preset short circuit resistance or equal to a second preset short circuit resistance, that the internal short circuit in the battery is slight;
- determining, if the internal short circuit resistance $R_i$ of the battery is less than the second preset short circuit resistance and greater than or equal to a third preset short circuit resistance, that the internal short circuit in the battery is moderate; and
- determining, if the internal short circuit resistance $R_i$ of the battery is less than the third preset short circuit resistance, that the internal short circuit in the battery is severe.

Preferably, the second preset short circuit resistance may be 100 ohms, or other values such as 80 ohms, 90 ohms, 110 ohms, or 120 ohms, depending on specific needs. Preferably, the third preset short circuit resistance may be 10 ohms, or other values such as 8 ohms, 9 ohms, 11 ohms, or 12 ohms, depending on specific needs.

In this embodiment, in order to handle the internal short circuit, the method further includes:

- sending, if it is determined that the internal short circuit of the battery is slight, a level-three internal-short-circuit alarm to the user;

sending, if it is determined that the internal short circuit of the battery is moderate, a level-two internal-short-circuit alarm to the user, and limiting an output power of the battery; and sending, if it is determined that the internal short circuit of the battery is severe, a level-one internal-short-circuit alarm to the user, and cutting off a charge-and-discharge circuit of the battery.

In this application, the internal short circuit resistance $R_i$ of the battery is determined based on the battery-charging standard parameter, the voltage $V_0$, the voltage difference ΔV, and the charge current I, and whether an internal short circuit exists in the battery is determined based on the internal short circuit resistance $R_i$ of the battery. In this way, during charging of a stand-alone battery, whether an internal short circuit exists in the battery is determined by detecting the internal short circuit resistance of the stand-alone battery. The method satisfies an application scenario in which a portable electronic device is frequently charged and discharged.

Still referring to FIG. 1, in this embodiment, the memory 11 may be an internal memory of the electronic device, that is, a memory built in the electronic device. In other embodiments, the memory 11 may be an external memory of the electronic device, that is, a memory externally connected to the electronic device.

In some embodiments, the memory 11 is configured to store program code and various data, and access the programs or data automatically at a high speed during operation of the electronic device.

The memory 11 may include a random access memory, and may further include a non-volatile memory, such as a hard disk, an internal memory, a plug-in hard disk, a smart media card (Smart Media Card, SMC), a secure digital (Secure Digital, SD) card, a flash card (Flash Card), at least one disk storage device, a flash memory device, or other volatile solid-state storage devices.

In an embodiment, the processor 12 may be a central processing unit (Central Processing Unit, CPU), or may be another general-purpose processor, a digital signal processor (Digital Signal Processor, DSP), an application-specific integrated circuit (Application Specific Integrated Circuit, ASIC), a field programmable gate array (Field-Programmable Gate Array, FPGA), or another programmable logical device, a discrete gate, or a transistor logical device, a discrete hardware component, or the like. The general-purpose processor may be a microprocessor, or the processor may be any other conventional processor or the like.

The program code and various data in the memory 11, when implemented in the form of a software functional unit and sold or used as an independent product, may be stored in a computer-readable storage medium. Based on such an understanding, all or part of the processes of the method described in the foregoing embodiments, for example, the steps of the battery voltage difference update method or the charge estimation method according to this application, may be performed by relevant hardware instructed by a computer program. The computer program may be stored in a computer-readable storage medium. When executed by a processor, the computer program can perform the steps in each method embodiment described above. The computer program includes computer program code. The computer program code may be in the form of source code, object code, an executable file, or some intermediate forms, or the like. The computer-readable medium may include any entity or device capable of carrying the computer program code, record medium, USB disk, mobile hard disk, magnetic disk, optical disk, computer memory, read-only memory (ROM, Read-Only Memory), and the like.

Understandably, the division into the modules is a logical function division, and may be in other division forms in actual implementation. In addition, function modules in each embodiment of this application may be integrated into one processing unit, or each module may exist physically alone, or two or more modules may be integrated into one unit. The integrated module may be implemented in the form of hardware, or may be implemented in the form of hardware plus a software function module.

To a person skilled in the art, it is evident that this application is not limited to the details of the exemplary embodiments described above, and this application can be implemented in other specific forms without departing from the spirit or essential features of this application. Therefore, the foregoing embodiments of this application are construed in all respects as exemplary but not restrictive. The scope of this application is defined by the claims appended hereto rather than the foregoing description. Therefore, all changes that fall within the meanings and scope of equivalents of the claims are intended to be incorporated in this application.

To a person skilled in the art, it is evident that this application is not limited to the details of the exemplary embodiments described above, and this application can be implemented in other specific forms without departing from the spirit or essential features of this application. Therefore, the foregoing embodiments of this application are construed in all respects as exemplary but not restrictive. The scope of this application is defined by the claims appended hereto rather than the foregoing description. Therefore, all changes that fall within the meanings and scope of equivalents of the claims are intended to be incorporated in this application.

What is claimed is:

1. A method for detecting an internal-short-circuit in a battery, the method comprising:

obtaining a battery-charging standard parameter;

obtaining a voltage $V_0$ of the battery when the battery enters a constant-current charging phase;

obtaining a voltage difference ΔV generated across a charging time frame Δt during constant-current charging of the battery;

obtaining a charge current I when the battery has been charged for the time frame Δt;

determining an internal short circuit resistance $R_i$ of the battery based on the battery-charging standard parameter, the voltage $V_0$, the voltage difference ΔV, and the charge current I; and determining, based on the internal short circuit resistance $R_i$ of the battery, whether the internal short circuit exists in the battery;

wherein the battery is a rechargeable battery.

2. The method according to claim 1, wherein the obtaining a voltage difference ΔV generated across a charging time frame Δt during constant-current charging of the battery comprises:

obtaining a voltage $V_1$ of the battery at a constant-current charging time point $t_1$;

obtaining a voltage $V_2$ of the battery at a constant-current charging time point $t_2$, wherein $t_2=t_1+\Delta t$; and determining the voltage difference ΔV based on the voltage $V_1$ and the voltage $V_2$; and the obtaining a charge current I when the battery has been charged for the time frame Δt comprises:

obtaining a charge current I of the battery in a time frame from the time point $t_1$ to the time point $t_2$.

3. The method according to claim 1, wherein the obtaining a battery-charging standard parameter comprises:

obtaining the battery-charging standard parameter through an equivalent circuit model of the battery.

4. The method according to claim 3, wherein, before the obtaining the battery-charging standard parameter through an equivalent circuit model of the battery, the method further comprises:

obtaining a first standard voltage difference equation that comprises a standard parameter equation of the battery, wherein the first standard voltage difference equation is obtained through the equivalent circuit model of the battery;

obtaining each standard voltage difference of the battery generated across the charging time frame $\Delta t$ during the charging performed at different standard charge currents under different numbers of cycles; and determining the battery-charging standard parameter based on the first standard voltage difference equation and each standard voltage difference of the battery generated across the charging time frame $\Delta t$ during the charging performed at different standard charge currents under different numbers of cycles, wherein the battery-charging standard parameter is obtained through the equivalent circuit model of the battery.

5. The method according to claim 4, wherein, before the obtaining a first standard voltage difference equation that comprises a standard parameter equation of the battery, wherein the first standard voltage difference equation is obtained through the equivalent circuit model of the battery, the method further comprises:

determining a standard equation of the equivalent circuit model of the battery based on a capacitance definition formula and a current definition formula;

determining, based on the standard equation of the equivalent circuit model of the battery, a second standard voltage difference equation generated when the battery has been charged for the time frame $\Delta t$; and determining the first standard voltage difference equation based on the second standard voltage difference equation.

6. The method according to claim 5, wherein the standard equation of the equivalent circuit model of the battery comprises:

$$V_{standard} = U_{oc} + U_{s0}e^{-\frac{t}{R_sC_s}} + R_sI_{standard}\left(1 - e^{-\frac{t}{R_sC_s}}\right) + I_{standard}R_0,$$

wherein, $V_{standard}$ is a standard voltage of the battery, $U_{oc}$ is an open circuit voltage of the battery, $U_{s0}$ is an initial component voltage value of a polarization capacitor of the battery in a statically standing state, t is a charging time length of the battery, $R_s$ is a polarizing internal resistance of the battery, $C_s$ is a polarization capacitance of the battery, $I_{standard}$ is a standard charge current of the battery, and $R_0$ is an ohmic internal resistance of the battery.

7. The method according to claim 4, wherein the battery-charging standard parameter comprises a first battery-charging standard parameter and a second battery-charging standard parameter, and the first standard voltage difference equation comprises:

$$\Delta V_{standard} = \alpha I_{standard} - \alpha\beta, \text{ wherein,}$$

-continued $$\alpha = R_s\left(e^{-\frac{t_1}{R_sC_s}} - e^{-\frac{t_2}{R_sC_s}}\right), \text{ and } \beta = \frac{U_{S0}}{R_s},$$

wherein, $t_2=t_1+\Delta t$, $\Delta V_{standard}$ is a standard voltage difference generated when the battery has been charged for the time frame $\Delta t$, $I_{standard}$ is a standard charge current when the battery has been charged for the time frame $\Delta t$, $\alpha$ is the first battery-charging standard parameter, $R_s$ is a polarizing internal resistance of the battery, $t_1$ is a first constant-current charging time point, $C_s$ is a polarization capacitance of the battery, $t_2$ is a second constant-current charging time point, $\beta$ is the second battery-charging standard parameter, and $U_{s0}$ is an initial component voltage value of a polarization capacitor of the battery in a statically standing state.

8. The method according to claim 1, wherein the determining an internal short circuit resistance $R_i$ of the battery based on the battery-charging standard parameter, the voltage $V_0$, the voltage difference $\Delta V$, and the charge current I comprises:

determining a first equation of an equivalent circuit model of the battery based on a capacitance definition formula and a current definition formula;

determining, based on the first equation of the equivalent circuit model of the battery, a voltage difference equation generated when the battery has been charged for the time frame $\Delta t$; and determining an internal short circuit resistance $R_i$ of the battery based on the voltage difference equation, the battery-charging standard parameter, the voltage $V_0$, the voltage difference $\Delta V$, and the charge current I.

9. The method according to claim 8, wherein the first equation of the equivalent circuit model of the battery comprises:

$$V = IR_S + IR_0 + U_{oc} - R_s\left(I - \frac{U_{s0}}{R_s} + \frac{V_0}{R_i}\right)e^{-\frac{t}{R_sC_s}},$$

wherein, V is a voltage of the battery, I is the charge current when the battery has been charged for the time frame $\Delta t$, $R_s$ is a polarizing internal resistance of the battery, $R_0$ is an ohmic internal resistance of the battery, $U_{oc}$ is an open circuit voltage of the battery, $U_{s0}$ is an initial component voltage value of a polarization capacitor of the battery in a statically standing state, $V_0$ is a voltage of the battery when the battery enters the constant-current charging phase, and $R_i$ is an internal short circuit resistance of the battery.

10. The method according to claim 8, wherein the determining a first equation of an equivalent circuit model of the battery based on a capacitance definition formula and a current definition formula comprises:

creating the equivalent circuit model of the battery;

determining a second equation of the equivalent circuit model of the battery based on the Ohm's law and the Kirchhoff's law; and determining the first equation of the equivalent circuit model of the battery based on the capacitance definition formula, the current definition formula, and the second equation of the equivalent circuit model of the battery.

11. The method according to claim 10, wherein the determining the first equation of the equivalent circuit model of the battery based on the capacitance definition formula, the current definition formula, and the second equation of the equivalent circuit model of the battery comprises:

determining a differential equation of a component voltage of a polarization capacitor of the battery based on the capacitance definition formula and the current definition formula;

solving the differential equation of the component voltage of the polarization capacitor of the battery to determine a general solution to the component voltage of the polarization capacitor of the battery; and determining the first equation of the equivalent circuit model of the battery based on the second equation of the equivalent circuit model of the battery and the general solution to the component voltage of the polarization capacitor of the battery.

12. The method according to claim 11, wherein the differential equation of the component voltage of the polarization capacitor of the battery comprises:

$$C_s\frac{dU_s}{dt}+\frac{U_s}{R_s}=I-\frac{V}{R_i},$$

wherein, $C_s$ is a polarization capacitance of the battery, $U_s$ is the component voltage of the polarization capacitor of the battery, $R_s$ is a polarizing internal resistance of the battery, I is a charge current when the battery has been charged for the time frame Δt, V is a voltage of the battery, and $R_i$ is an internal-short-circuit resistance of the battery; and the general solution to the component voltage of the polarization capacitor of the battery comprises:

$$U_s=\left(U_{s0}-\frac{V_0}{R_i}R_s\right)e^{-\frac{t}{R_sC_s}}+R_s\left(I-\frac{V}{R_i}\right)\left(1-e^{-\frac{t}{R_sC_s}}\right),$$

wherein, $U_s$ is the component voltage of the polarization capacitor of the battery, $U_{s0}$ is an initial component voltage value of the polarization capacitor of the battery in a statically standing state, $V_0$ is the voltage of the battery when the battery enters the constant-current charging phase, $R_i$ is the internal short circuit resistance of the battery, $R_s$ is the polarizing internal resistance of the battery, t is a charging time length of the battery, $C_s$ is the polarization capacitance of the battery, I is the charge current when the battery has been charged for the time frame Δt, and V is the voltage of the battery.

13. The method according to claim 8, wherein before the determining an internal short circuit resistance $R_i$ of the battery based on the voltage difference equation, the battery-charging standard parameter, the voltage $V_0$, the voltage difference ΔV, and the charge current I, the method further comprises:

obtaining a standard parameter equation of the battery, wherein the standard parameter equation is obtained through the equivalent circuit model of the battery; and the determining an internal short circuit resistance $R_i$ of the battery based on the voltage difference equation, the battery-charging standard parameter, the voltage $V_0$, the voltage difference ΔV, and the charge current I comprises:

determining an internal short circuit resistance equation of the battery based on the voltage difference equation and the standard parameter equation of the battery; and determining the internal short circuit resistance $R_i$ of the battery based on the internal short circuit resistance equation of the battery, the battery-charging standard parameter, the voltage $V_0$, the voltage difference ΔV, and the charge current I.

14. The method according to claim 13, wherein the battery-charging standard parameter comprises a first battery-charging standard parameter and a second battery-charging standard parameter, and the internal short circuit resistance equation of the battery comprises:

$$R_i=\frac{V_0}{\frac{\Delta V}{\alpha}-I+\beta},$$

wherein, $R_i$ is the internal short circuit resistance of the battery, $V_0$ is a voltage of the battery when the battery enters the constant-current charging phase, ΔV is the voltage difference generated across the charging time frame Δt during constant-current charging of the battery, α is the first battery-charging standard parameter, β is the second battery-charging standard parameter, and I is the charging current when the battery has been charged for the time frame Δt.

15. An electronic device, wherein the electronic device comprises:

a battery;

a processor; and a memory, wherein the memory stores a plurality of program modules, and the plurality of program modules are loaded by the processor and execute the battery internal-short-circuit detection method according to claim 1.

16. A non-transitory storage medium on which at least one computer instruction is stored, wherein the instruction is loaded by a processor to execute the battery internal-short-circuit detection method according to claim 1.

* * * * *